United States Patent [19]
Lee

[11] Patent Number: 5,721,169
[45] Date of Patent: Feb. 24, 1998

[54] MULTIPLE STORAGE PLANES READ ONLY MEMORY INTEGRATED CIRCUIT DEVICE AND METHOD OF MANUFACTURE THEREOF

[75] Inventor: Bob Hsino-Lun Lee, Sunnyvale, Calif.

[73] Assignee: Chartered Semiconductor Manufacturing PTE Ltd., Singapore, Singapore

[21] Appl. No.: 639,392

[22] Filed: Apr. 29, 1996

[51] Int. Cl.$^6$ ............................................. H01L 21/8246
[52] U.S. Cl. .................................. 438/278; 438/588
[58] Field of Search ................................ 438/130, 275, 438/276, 277, 278, 290, 587, 588

[56] References Cited

U.S. PATENT DOCUMENTS

| | | | |
|---|---|---|---|
| 5,358,887 | 10/1994 | Hong | 438/278 |
| 5,383,149 | 1/1995 | Hong | 365/104 |
| 5,426,066 | 6/1995 | Fu et al. | 438/278 |
| 5,429,968 | 7/1995 | Koyama | 438/278 |

Primary Examiner—Chandra Chaudhari
Attorney, Agent, or Firm—George O. Saile; Stephen B. Ackerman; Graham S. Jones, II

[57] ABSTRACT

A ROM memory array comprises a doped silicon substrate having a surface with a first array of parallel bitlines formed in the substrate at the surface with an array of channel regions between the bitlines. A dielectric layer is formed on the substrate with a wordline array composed of transversely disposed parallel conductors formed on the dielectric layer, with the bitlines and the channel regions and the wordline array forming an array of field effect transistors. A gate oxide layer is formed over the wordlines. A thin film polysilicon storage plane is formed over the gate oxide layer with a second array of alternating parallel bitlines and channel regions formed in the thin film polysilicon storage plane. The second array of bitlines and channel regions is orthogonally disposed relative to the wordline array and the second array of bitlines is formed in a storage plane over an interpolysilicon oxide dielectric isolation layer. The wordline array and the second array of parallel bitlines and channel regions form an array of thin film transistors.

20 Claims, 12 Drawing Sheets

MULTIPLE STORAGE PLANES READ ONLY MEMORY INTEGRATED CIRCUIT DEVICE AND METHOD OF MANUFACTURE THEREOF

BACKGROUND OF THE INVENTION

1. Field of the Invention

This invention relates to Read Only Memory (ROM) integrated circuit devices, and more particularly to improved structural arrangements thereof, and to methods of manufacture thereof.

2. Description of Related Art

ROM devices are standard components of modern computer systems. A MOSFET ROM comprises an array of Metal Oxide Semiconductor Field Effect Transistor (MOSFET's) arranged in columns and rows, wherein predetermined MOSFET's are either permanently conductive or nonconductive as a function of the variety of transistor. The alternative on/off operation with changes in the states of operation of the MOSFETs is adapted to use for storage of data, which remains in the device when the external power supply is off.

A ROM device includes an array of parallel, closely spaced lines regions formed of a heavily doped impurity in a semiconductor substrate having an opposite type of background impurity. An insulating layer is formed on the surface of the substrate. Another array of closely spaced conductive lines formed on the surface of the insulating layer is arranged at right angles to the spaced lines in the substrate. Insulating layers are formed on the upper array of conductive lines. A metallurgy layer connects the two arrays of lines to circuits to address the lines and to read the data stored in the ROM, as is well known in the art.

At the intersection of a conductive line in the upper array which is commonly referred to in most cases as a "wordline" and a pair of adjacent lines in the substrate, known in most cases as the "bitlines", a MOSFET is formed. The spaced lines in the substrate comprise the source and drain of the MOSFET. The conductive wordline serves as the gate electrode of the MOSFET. Certain predetermined MOSFET's are made permanently non-conductive (turned off).

A problem with the trend in the semiconductor industry is the ever increasing density of circuits on a device. Accordingly, an object of this invention is to provide an improved design for a very high density ROM device.

Another objective, always desirable in electronic devices and other technologies, is the simplification of the structure and operation of devices. In the case of the very large number of circuits in the state of the art ROMs the need for simplification of structure and operation is as desirable as ever. Accordingly, it is an important object of this invention is to provide for simplification of the structure and the operation of ROM devices.

More recently a Thin Film Transistor (TFT) ROM device design has been described in U.S. Pat. Nos. 5,358,887 and 5,383,149 of Hong for "ULSI Mask ROM Structure and Method of Manufacture" which is formed above an oxide layer on top of a silicon substrate providing a double density memory array. The wordline array is composed of transversely disposed conductors sandwiched between two arrays of bitlines which are orthogonally disposed relative to the wordline array. The two arrays of bitlines are stacked with one above and with one below the wordline array. A first gate oxide layer is located between the wordline array and a first one of the array of bitlines and a second gate oxide layer is located between the wordline array and the other of the arrays of bitlines. The two parallel sets of polysilicon thin film transistors are formed with the wordlines serving as gates for the transistors.

An alternative ROM device provides a double density memory array in which a wordline array is composed of transversely disposed conductors. The wordline array is sandwiched between two bitlines arrays disposed orthogonally relative to the wordline array with bitlines arrays stacked with one above and with one below the wordline array. A first gate oxide layer is located between the wordline array and a first one of the arrays of bitlines. A second gate oxide layer is located between the wordline array and the other array of bitlines. Two parallel sets of polysilicon thin film transistors are formed with the wordlines serving as gates for the transistors.

Further progress is required in ROM design and construction to further increase the density of storage capacity beyond what has been provided by the MOSFET and TFT designs described above.

SUMMARY OF THE INVENTION

In accordance with this invention, a method is provided for manufacture of a ROM structure on a doped silicon semiconductor substrate with a surface by the following steps. Form a dielectric layer on the surface of the substrate. Form a first array of bitlines in the substrate at the surface below the gate oxide layer. Form a first parallel array of wordlines over the dielectric layer, with the first array of wordlines orthogonally oriented relative to the first array of bitlines. Then form a first dielectric layer covering the wordlines and exposed portions of the dielectric layer; and form a first thin film polysilicon layer comprising a storage plane over the first dielectric layer with a second array of alternating parallel bitlines and channel regions. The second array of bitlines and channel regions is orthogonally disposed relative to the first wordline array. Preferably, planarization of wordlines is achieved through formation of an oxide layer planarized by a method selected from the group consisting of an etchback process or a chemical mechanical polish process. The wordlines are formed of polysilicon deposited by chemical vapor deposition followed by doping.

Preferably, additional the following steps are performed. Form an isolation dielectric layer over the first thin film polysilicon layer. Form a second thin film polysilicon layer comprising a storage plane over the isolation dielectric layer. Form a third array of bitlines and channel regions in the second thin film polysilicon layer. Form a second dielectric layer covering the second thin film polysilicon layer. Form a second parallel array of wordlines over the second dielectric layer, orthogonally oriented relative to the third array of bitlines. Form a third dielectric layer covering the second array of wordlines and exposed portions of the second dielectric layer. Form a third thin film polysilicon layer comprising a storage plane over the third dielectric layer, and form a fourth array of bitlines and channel regions in the third thin film polysilicon layer.

Preferably the process of forming the gate oxide layer and the dielectric layer is by thermal growth. The process of forming the first thin film polysilicon layer over the dielectric layer is by chemical vapor deposition. Wordlines are formed of polysilicon deposited by chemical vapor deposition followed by doping. The process of forming the gate oxide layer and the dielectric layer comprises thermal growth. Planarization of wordlines is achieved through formation of an oxide layer planarized by a method selected from the group consisting of an etchback process or a chemical mechanical polish process. A ROM code implant region is formed by doping with boron.

In accordance with another aspect of this invention a ROM device provides a memory array comprises a doped polysilicon substrate with a surface. A first array of parallel bitlines is formed in the substrate at the surface with an array of channel regions between the bitlines. A gate oxide layer is formed on the substrate. A wordline array composed of transversely disposed parallel conductors is formed on the gate oxide layer, with the bitlines and the channel regions and the wordline array forming an array of field effect transistors. A dielectric layer is formed over the wordlines. A thin film polysilicon layer comprising a storage plane is formed over the dielectric layer with a second array of alternating parallel bitlines and channel regions formed in the thin film polysilicon layer. The second array of bitlines and channel regions are orthogonally disposed relative to the wordline array. The second array of bitlines is formed over the dielectric layer. The wordline array and the second array of parallel bitlines and channel regions form an array of thin film transistors.

Preferably, the metal oxide semiconductor field effect transistors are formed with bitlines in the substrate and thin film transistors are formed in the thin film layer. A ROM device on a doped silicon semiconductor substrate has a surface. It includes a dielectric layer on the surface of the substrate; a first array of bitlines in the substrate at the surface below the dielectric layer; a first parallel array of wordlines over the dielectric layer, the first array of wordlines being orthogonally oriented relative to the first array of bitlines; a gate oxide layer covering the wordlines and exposed portions of the dielectric layer. A first thin film polysilicon layer comprising a storage plane over the first dielectric layer with a second array of alternating parallel bitlines and channel regions, the second array of bitlines and channel regions being orthogonally disposed relative to the first wordline array.

An isolation dielectric layer formed overlies the first thin film polysilicon layer. A second thin film polysilicon layer comprising a storage plane over the isolation dielectric layer. A third array of bitlines and channel regions is formed in the second thin film polysilicon layer. A second dielectric layer covers the second thin film polysilicon layer. A second parallel array of wordlines overlies the second dielectric layer. The second array of wordlines is orthogonally oriented relative to the third array of bitlines. A third dielectric layer covers the second array of wordlines and exposed portions of the second dielectric layer. A third thin film polysilicon layer comprising a storage plane overlies the third dielectric layer. A fourth array of bitlines and channel regions is formed in the third thin film polysilicon layer.

Preferably planarized wordline layers are covered with a planarized oxide layer. The wordlines are doped polysilicon deposited by chemical vapor deposition. The gate oxide layer and the dielectric layers are thermally grown layers. The thin film polysilicon layers were formed by chemical vapor deposition. A ROM code region is doped with boron.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
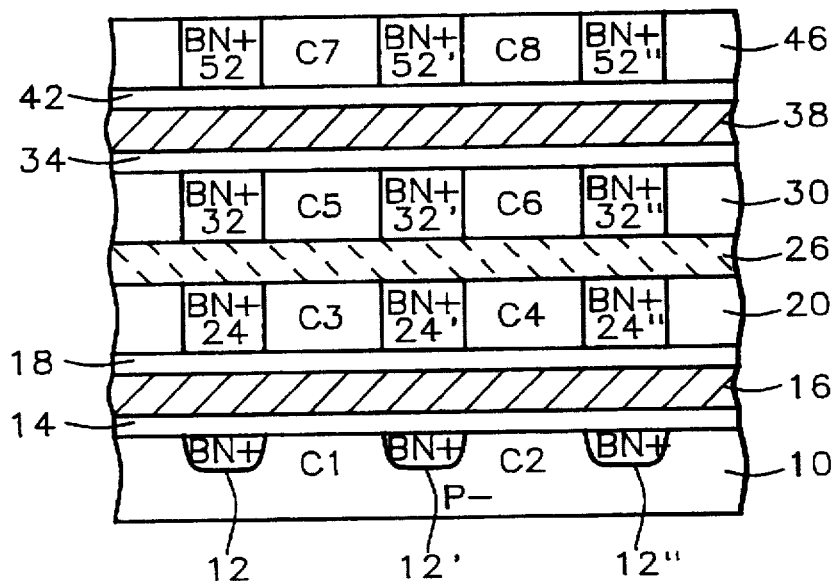
FIG. 1 shows a cross-sectional view of a ROM device providing a multilayer memory array in accordance with this invention.

FIG. 1 shows a cross-sectional view of a ROM device providing a multilayer memory array in accordance with this invention. A P– doped silicon substrate 10 has an upper surface covered by a silicon oxide layer 14. A first array of parallel bitlines 12, 12', 12", . . . is formed in the substrate at the surface with an array of channel regions C1, C2, . . . between the bitlines. A parallel array of parallel conductors comprising wordlines 16, 16', 16" (seen in FIGS. 4C–4L) are formed on the silicon oxide layer 14 forming MOSFET devices with the bitlines 12, 12', 12", . . . orthogonally disposed (i.e. extending transversely at right angles) relative to the bitlines. There are channel regions C1, C2, . . . in the substrate formed between the bitlines. A gate oxide (silicon dioxide dielectric) layer 18 is formed over the wordlines 16, 16', 16". A thin film polysilicon storage plane layer 20 is formed over the dielectric layer 18 with a second array of alternating parallel bitlines 24, 24', 24", . . . and channel regions C3, C4, . . . formed in the storage plane layer 20. The second array of bitlines 24, 24', 24", . . . and channel regions C3, C4, . . . is orthogonally disposed (i.e. extending transversely at right angles) relative to the wordline array 16, 16', 16".

An isolation dielectric (InterPolysilicon Oxide) IPO layer 26 is formed over the first storage plane layer 20.

A second thin film polysilicon storage plane layer 30 is formed over the isolation dielectric layer. A third array of bitlines 32, 32', 32", . . . and channel regions C5, C6, . . . are formed in the second storage plane layer 30. A second dielectric layer 34 covers the second storage plane storage plane layer 30. A second parallel array of wordlines 38, 38', 38" . . . (FIG. 4H) is formed over the second dielectric layer 34 orthogonally disposed (i.e. extending transversely at right angles) relative to the bitlines 32, 32', 32", . . . .

A third dielectric layer 42 covers the second array of wordlines 38, 38', 38" . . . and exposed portions of the second dielectric layer 34. A third thin film polysilicon storage plane layer 46 is formed over the third dielectric layer 42. A fourth array of bitlines 52, 52', 52", . . . and channel regions C7, C8, . . . in the third storage plane layer 46. Bitlines 52, 52', 52" extend orthogonally oriented relative wordlines 38, 38', 38" . . . .

Figure 2A:
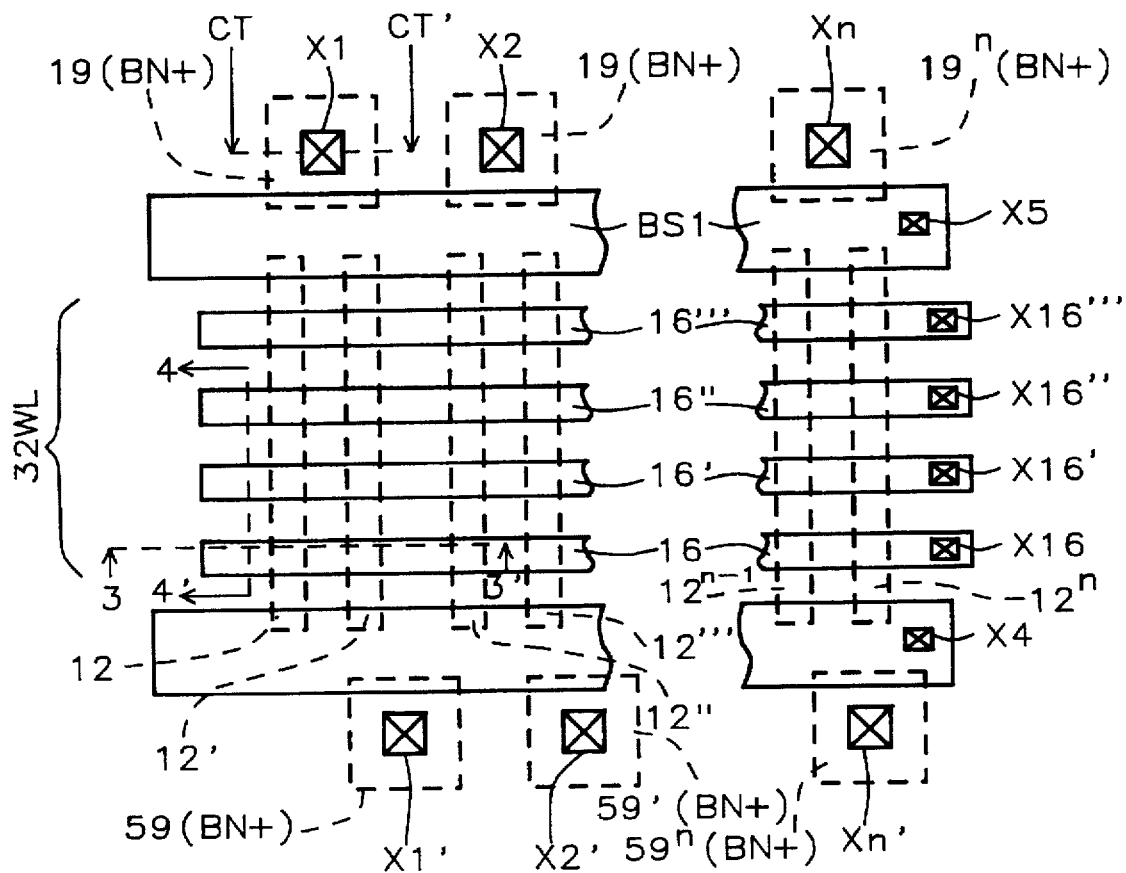
FIG. 2A shows a plan view of the device of FIG. 1.

FIG. 2A shows the device of FIG. 1 in plan view. FIG. 1 is taken along a section line 3-3' in FIG. 2A. In FIG. 2A a larger portion of the array of bitlines 12, 12', 12", 12"', . . . , 12$^{n-1}$, 12$^n$ buried in the substrate 10 is shown in phantom. The array of wordlines 16, 16', 16", 16"' . . . . is shown extending at right angles to the bitlines 12 . . . 12$^n$ in accordance with the description above. Preferably there are thirty-two wordlines in the array, although only four wordlines are shown for convenience of illustration. Portions of the wordlines are broken away for convenience of illustration. Extended sections of the wordlines 16, 16', 16", 16'" on the right ends lead to conventional wordline contacts X16, X16', X16", X16'".

Above the substrate 10 in the wordline layers 16 and 38 are bank select conductors BS1 and BS2 formed of BN+ regions implanted in polysilicon. Bank select lines are on layers 16 and 38. The bitlines 12 ... 12" overlap with a bank select conductor BS1 connected to contact X5.

A buried BN+ region 19 aligned with bitlines 12 and 12' overlaps the bank select conductor BS1. A contact X1 is connected to region 19. A buried BN+ region 19', which is aligned with BN+ bitlines 12" and 12'" also overlaps the bank select conductor BS1. A contact X2 is connected to region 19'. Another buried bitline contact Xn is shown connected to a buried BN+ region 19" which is aligned with the last of the set of BN+ bitlines $12^{n-1}$, $12^n$.

Shown in phantom are BN+regions 19, 19', 19", 59, 59' and 59" formed in the silicon substrate 10. A first row of contacts X1, X2 and Xn is shown extending down into the substrate 10. Contacts X1 and X2 contact regions 19, 19', and 19" respectively. A second row of contacts X1', X2' and Xn' is shown extending down into the substrate. Contacts X1', X2' and Xn' extend down into contact with BN+ regions 59, 59', and 59" in substrate 10, respectively.

Bank select conductor BS1 overlaps with the regions 19 and 19', and the upper ends of buried regions 12, 12', 12" and 12'", most of which are seen in FIGS. 3B-3L and FIG. 1 in a cross-sectional view. Bank select conductor BS2 overlaps with the regions 59 and 59', and the lower ends of the BN+ bitline regions 12, 12', 12" and 12'".

The bitlines are connected to metal after the storage planes are built and a BPSG dielectric layer is put down to isolate the P– doped polysilicon film 46, from metal.

Figure 2B:
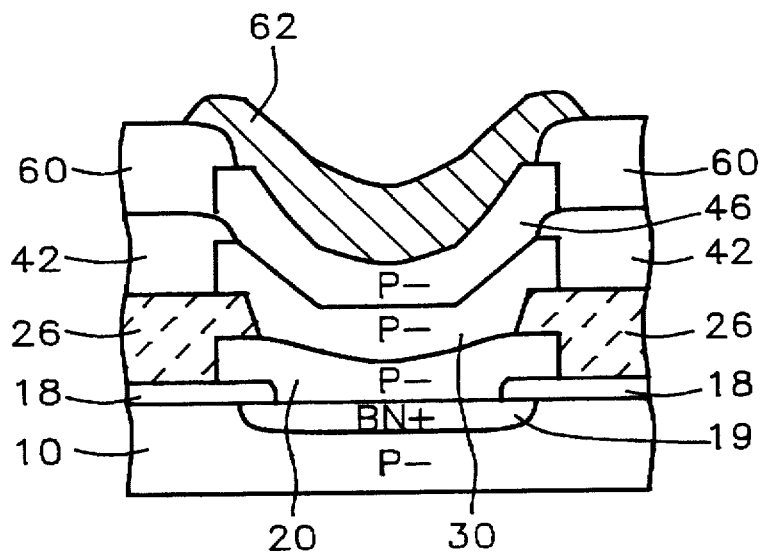
FIG. 2B shows a cross-sectional view of a contact area taken along line CT-CT' in FIG. 2A.

FIG. 2B shows a cross-sectional view of a contact area taken along line CT–CT' in FIG. 2A of the contact areas X1. The P– doped silicon substrate 10 has a BN+ region 19 formed in the upper surface of substrate 10. The dielectric layer 18 is formed over the substrate 10 and region 19 with a window exposing a portion of the surface of BN+ region 19. The storage plane layer 20 is formed over the dielectric layer 18 extending down through the window in layer 18 into contact with the upper surface of BN+ region 19. The isolation dielectric layer 26 is formed over the first storage plane layer 20 with an opening over the top surface of storage plane layer 20. The second storage plane layer 30 is formed over the isolation dielectric layer.

A third dielectric layer 42 is formed over the layers 30 and 26 with an opening down to the surface of storage plane layer 30.

A third thin film polysilicon storage plane layer 46 is formed over the third dielectric layer 42. A BPSG (borophosphosilicate glass) dielectric layer 60 is formed over layer 42 and storage plane layer 46 with a window open to expose the surface of storage plane layer 46. A metal contact layer 62 is formed extending through the window down to the surface of storage plane layer 46.

The preferred process of fabrication of a device in accordance with this invention is shown in a sequence of drawings FIGS. 3A to 3L and FIGS. 4A to 4L which illustrate twelve successive stages in the process of manufacture of a device made in accordance with this invention.

FIGS. 3A to 3L are sectional views of the device of FIG. 2 taken along line 3–3' in FIG. 2 illustrating the process of forming the device of FIG. 1.

FIGS. 4A to 4L are sectional views of the device of FIG. 2 taken along line 4–4' in FIG. 2 illustrating the process of forming the device of FIG. 1.

Figure 3A:
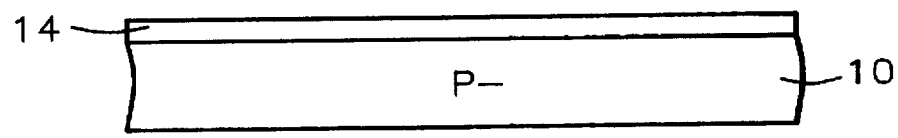
FIGS. 3A to 3L are sectional views of the device of FIG. 2 taken along line 3-3' in FIG. 2 illustrating the process of forming the device of FIG. 1.
Figure 4A:
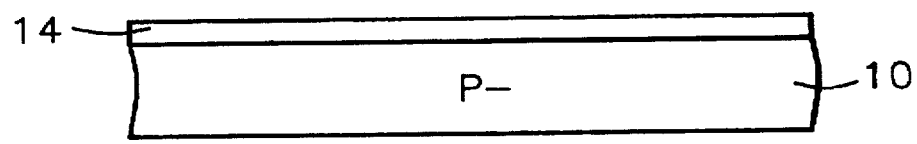
FIGS. 4A to 4L are sectional views of the device of FIG. 2 taken along line 4-4' in FIG. 2 illustrating the process of forming the device of FIG. 1.

Referring to FIGS. 3A and 4A, a conventional P– doped silicon semiconductor substrate 10 has a conventional silicon oxide layer 14 formed thereon suitable for manufacture of a MOSFET ROM device.

Figure 3B:
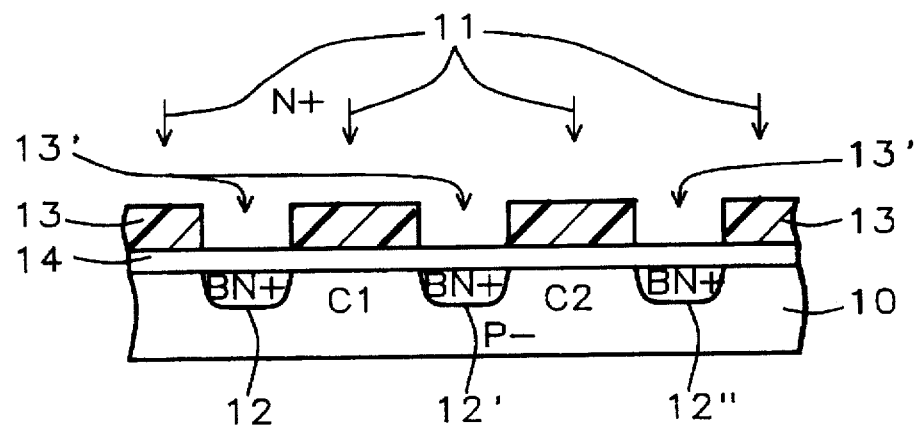
Figure 3C:
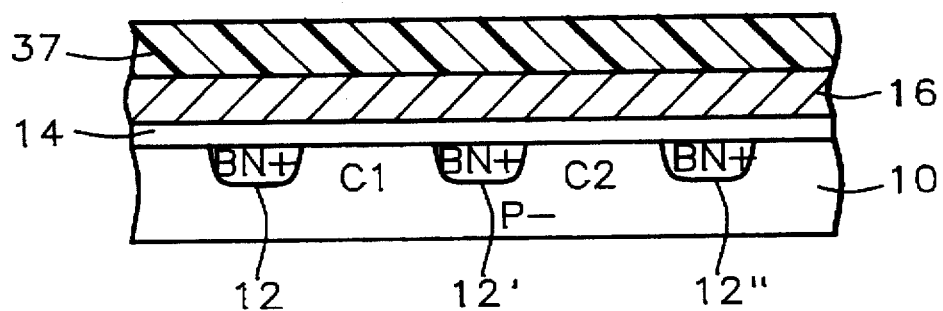
Figure 4B:
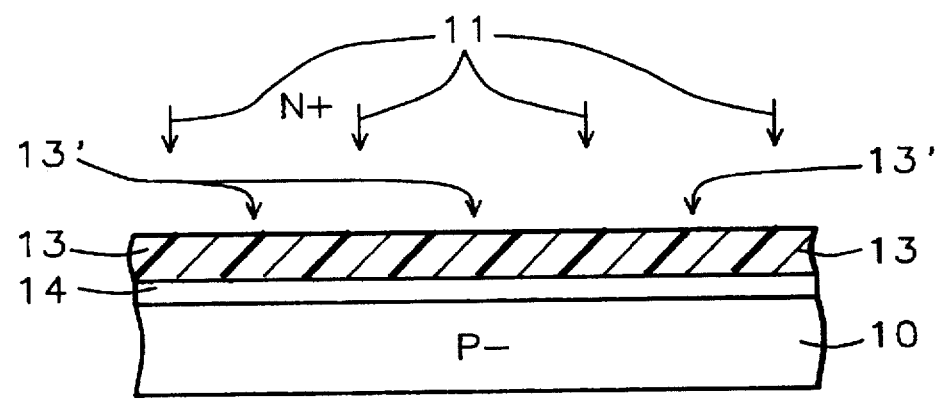

FIGS. 3B and 4B show the product of FIGS. 3A and 4A after a buried bitline mask 13 with openings 13' therethrough has been formed on silicon oxide layer 14 followed by doping by ion implantation by N-type ions 11 to form a parallel array of buried bitline regions 12, 12', 12" ... below silicon oxide layer 14 and below the surface of the substrate 10. The dopant 11 is preferably Arsenic chemical species which was ion implanted with a dose yielding doping with a density in bitline regions 12, 12', 12" from about 5 E 18 atoms/cm$^3$ to about 1 E 20 atoms/cm$^3$ in regions substrate 10, at an energy from about 30 keV to about 120 keV. The array of parallel array of buried bitline regions 12, 12', 12" ... are spaced apart by substantially equal distances with channel regions for MOSFET devices therebetween. The buried bitline regions 12, 12', 12" ... serve as source/drain (S/D) regions which will interact with the wordlines to be formed above the silicon oxide layer 14 as described in connection with FIGS. 3C and 4C. A channel region is shown in FIG. 4B, as the section line 4–4' runs through the center of a channel. Between the buried bitline regions 12, 12', 12" are located the channel regions C1 and C2, among other channel regions not discussed for convenience of description.

Figure 4C:
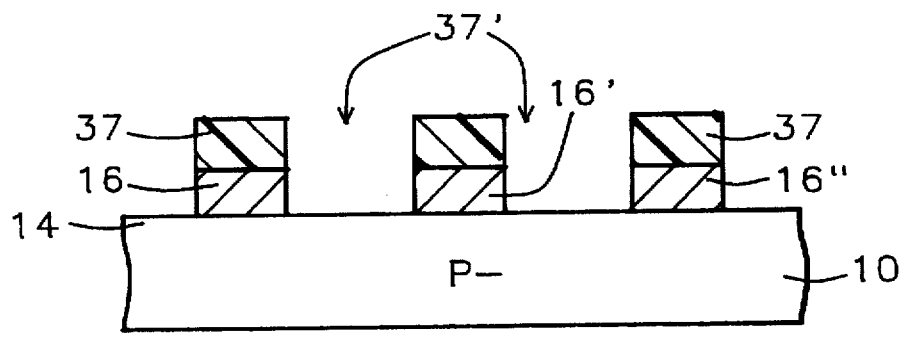

FIGS. 3C and 4C show the product of FIGS. 3B and 4B after a blanket polysilicon/polycide control gate/wordline layer 16 has been formed on the silicon oxide layer 14 followed by formation of a patterned photoresist mask 37 formed over layer 16 with openings 37' (FIG. 4C) therethrough to form wordlines 16, 16', 16' (FIG. 4C) by etching away portions of layer 16 below the openings 37' with a conventional etchant for polysilicon/polycide. The lines formed after etching will be the wordlines 16, 16', 16".

Layer 16 is formed to a thickness from about 2,700 Å to about 5,000 Å using a conventional method, such as LPCVD.

Layer 16 can be a laminated polycide structure in which a polysilicon thickness is covered with a thickness of a refractory metal silicide on the surface. The resulting structure is conventionally referred to as a polycide layer. To lower sheet resistance of the layer 16, the polycide portion thereof can be a molybdenum silicide, tungsten silicide, tantalum silicide and titanium silicide.

The entire polysilicon/polycide layer 16 has been doped N– by ion implantation in conventional process step not illustrated because it is conventional. The preferred chemical species of the dopant ions implanted is Phosphorus with a doping concentration from about 1 E 14 atoms/cm$^2$ to about 9 E 15 atoms/cm$^2$, at an energy from about 20 keV to about 100 keV.

Figure 3D:
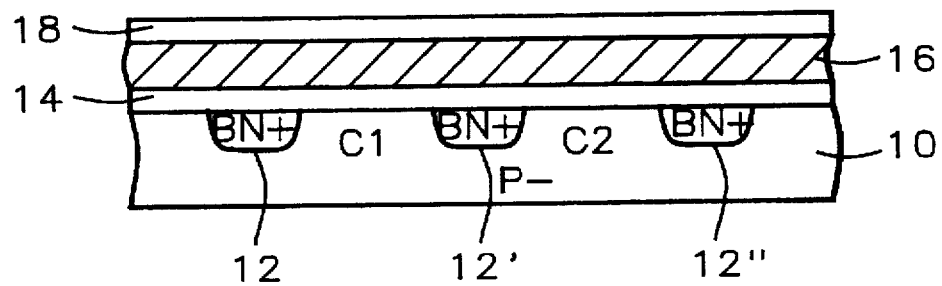
Figure 4D:
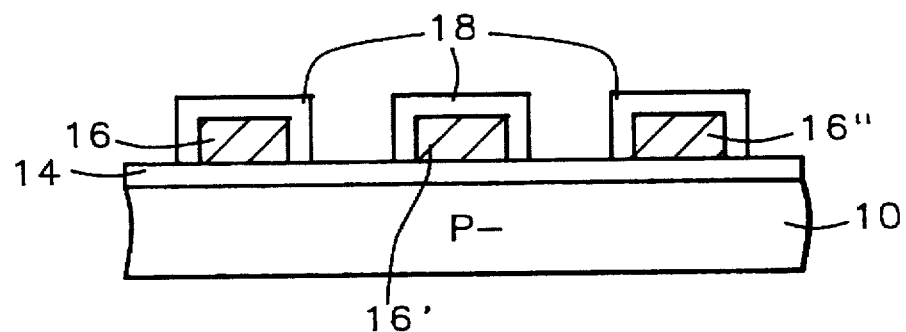

Next, FIGS. 3D and 4D show the product of FIGS. 3C and 4C after the polysilicon layer 16 has been coated with a thin film of gate oxide 18 which is grown thermally (by thermal oxidation) on the exposed surface of polysilicon/polycide layer 16.

Thermal Oxidation

Thermal oxidation is performed in a heated reactor. A set of silicon wafers is supported in a vertical position in a slotted quartz boat in a cylindrical fused-quartz tube connected to a source of a pure gas flowing through the reactor, directed from the source past the wafers to an exit vent. The gas is selected from dry oxygen and water vapor. The oxidation temperature is from about 800° C. to about 1000° C., at a typical gas flow rate of about 10 liters/min. An automatic control system regulates the gas flow sequence, controls the insertion and removal of silicon wafers, ramps the temperature up (i.e., to increase the furnace temperature linearly from a low temperature to the oxidation temperature so that the wafers will not warp due to sudden temperature change), to maintain the oxidation temperature to within ±1° C., and ramps the temperature down when oxidation is completed.

Preferably, at this stage, three steps are employed to planarize the surface of the device of FIGS. 3D and 4D in the process of manufacture of the planarized layer 18 as explained below with reference to FIGS. 5A–5C which illustrate the steps employed to planarize the surfaces of the wordlines of FIGS. 3D and 4D, FIGS. 3I and 4I and FIGS. 3J and 4J in the process of manufacture of a device in accordance with this invention.

Figure 5A:
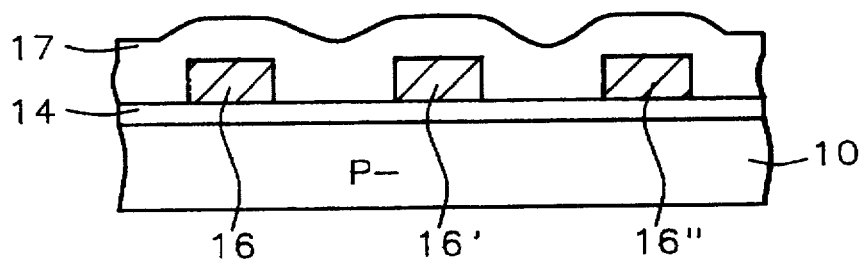
FIGS. 5A-5C illustrate the steps employed to planarize the surfaces of the wordlines of FIGS. 3D and 4D, FIGS. 3I and 4I and FIGS. 3J and 4J in the process of manufacture of a device in accordance with this invention.

Referring to FIG. 5A, the device of FIG. 3C is shown after after the photoresist layer has been removed leaving the wordlines 16, 16', 16" of FIG. 3D exposed as well as the remaining upper surface of layer 14.

The steps are as follows:

1. Deposit a blanket 6,000 Å thick layer 17 of silicon oxide (Oxide) by the process of chemical vapor deposition (CVD) producing the structure shown in FIG. 5A in which the wordlines 16, 16', 16" and layer 14 are covered by oxide layer 17.

2. Etch the 6,000 Oxide layer 17 until the upper surfaces of the wordlines 16, 16', 16" are exposed.

3. Grow a gate oxide layer 18 again on top of the wordlines 16, 16', 16" providing a planarized surface above the wordlines 16, 16', 16".

Formed over the gate oxide layer 18, an undoped thin film of polycrystalline silicon 20 for another plane of Thin Film Transistors (TFT's) is deposited. Film 20 is formed by Chemical Vapor Deposition (CVD) from silane ($SiH_4$) gas in a chemical vapor deposition chamber. Preferably the CVD process is an LPCVD (Low Pressure CVD) process performed at a temperature from about 575° C. to about 650° C.

Figure 3E:
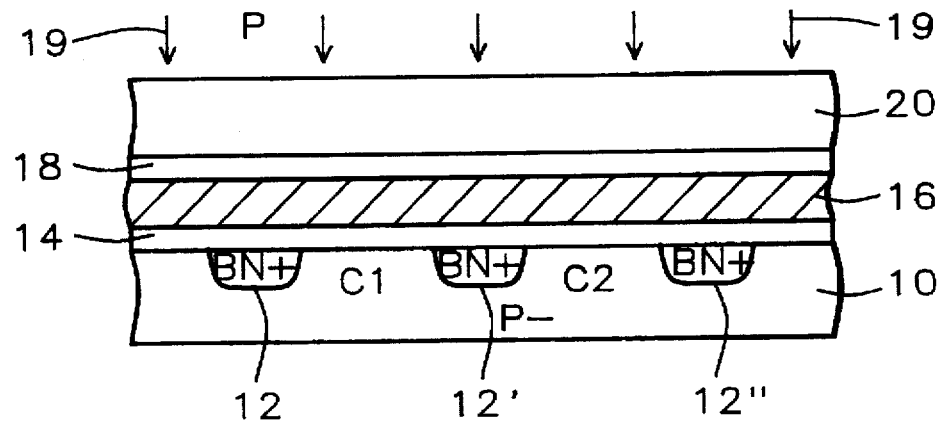
Figure 4E:
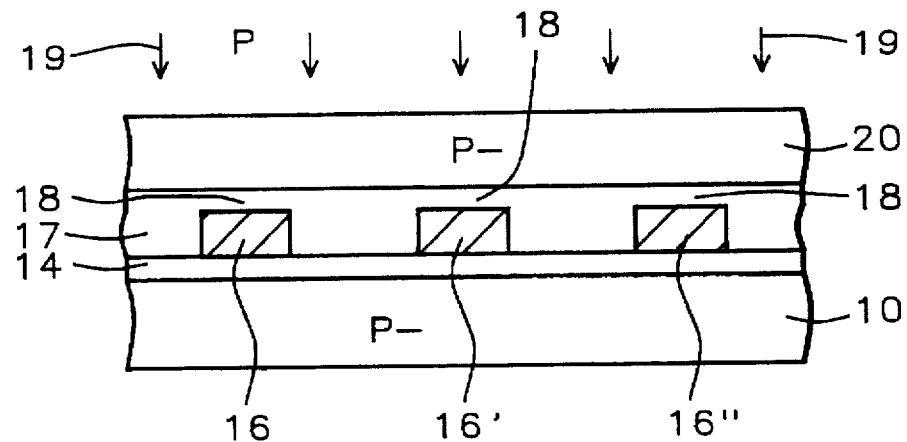

Referring to FIGS. 3E and 4E, the next step is that film 20 is doped with a blanket ion implantation of P-type dopant ions 19. The preferred chemical species of the dopant ions 19 implanted is boron with a doping concentration from about 4 E 14 atoms/$cm^3$ to about 5 E 17 atoms/$cm^3$, at an energy from about 20 keV to about 100 keV.

Figure 3F:
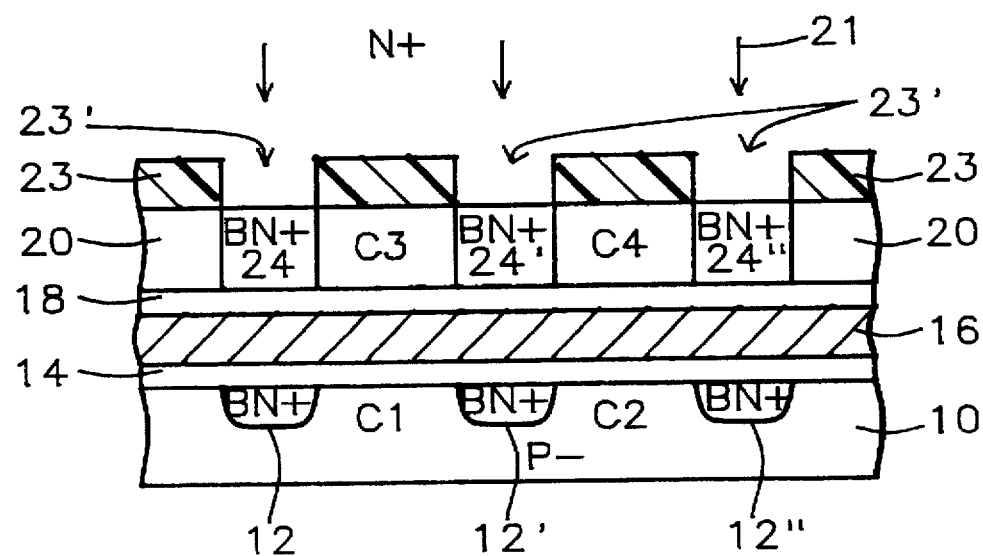
Figure 4F:
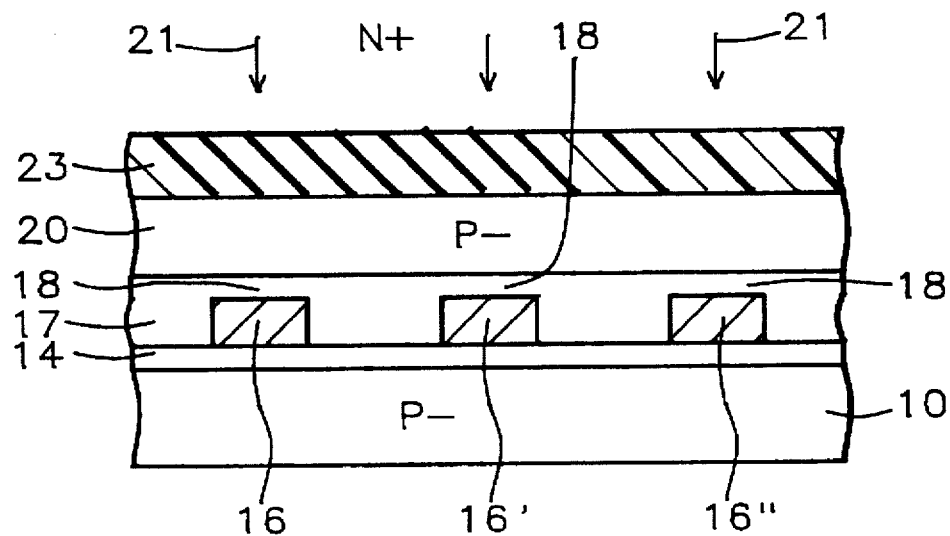

FIGS. 3F and 4F show the product of FIGS. 3E and 4E after a second BN+ photoresist mask 23 has been patterned on the film 20. Second channel mask 23 has been patterned with "BN+" openings 23' therethrough. N+ dopant ions 21 are implanted through the "BN+" openings 23' into a plurality of BN+ regions, including BN+ regions 24, 24', 24" below the openings 23' in BN+ mask 23. Between BN+ regions 24, 24' and 24" channel regions C3 and C4 are formed, among other channel regions not discussed for convenience of description. The preferred chemical species of the dopant 21 implanted is Arsenic with a doping concentration from about 5 E 18 atoms/$cm^3$ to about 1 E 20 atoms/$cm^3$, at an energy from about 30 keV to about 120 keV.

As a result of this step, within the film 20, surrounding P channel regions C3 and C4 are located buried N+ (BN+) S/D regions 24, 24', 24", . . . below the photoresist mask 23.

Figure 3G:
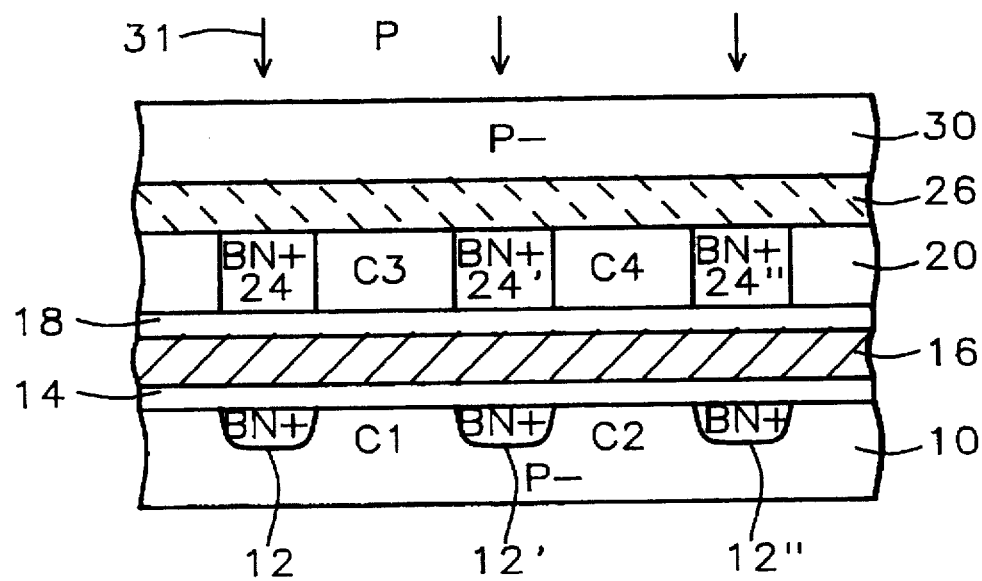
Figure 4G:
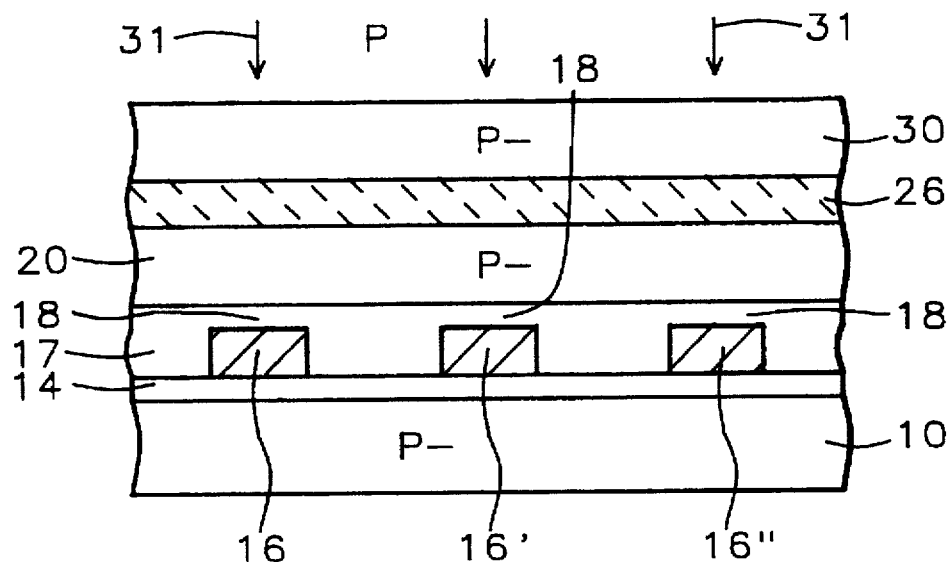

FIGS. 3G and 4G show the product of FIGS. 3F and 4F after first, the photoresist layer 23 is stripped from the structure of FIGS. 3F and 4F and then in the next step an interconductor dielectric (InterPolysiliocon Oxide) IPO layer 26 is formed upon the silicon film 20 with the buried bitlines 24, 24', 24" . . . by thermal deposition of silicon oxide followed by the deposition of a blanket thin film polysilicon storage plane layer 30 in a manner similar to the method of formation of polysilicon storage plane layer 20.

Next, film 30 is doped with a blanket ion implantation of P-type dopant ions 31. The preferred chemical species of the dopant ions 31 implanted is Boron with a doping concentration from about 4 E 14 atoms/$cm^3$ to about 5 E 17 atoms/$cm^3$, at an energy from about 20 keV to about 100 keV.

Figure 3H:
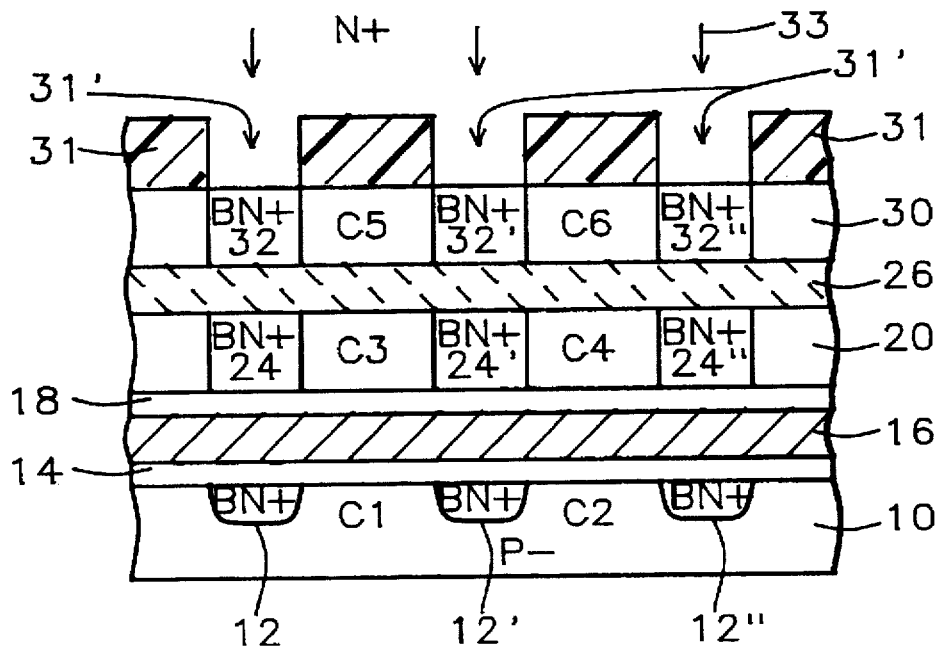
Figure 4H:
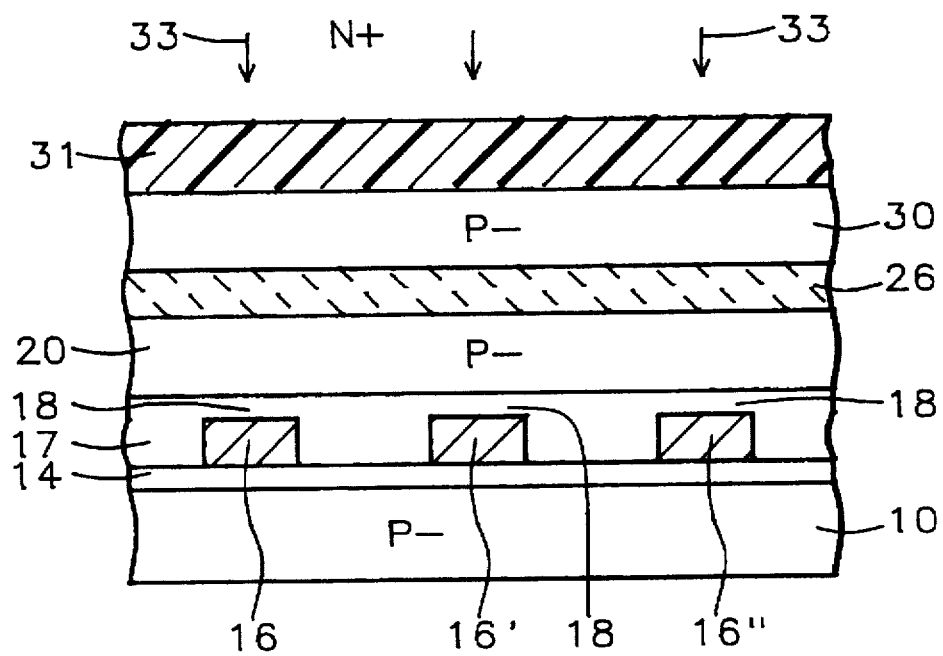

FIGS. 3H and 4H show the product of FIGS. 3G and 4G after a photoresist layer patterned into a third BN+ mask 31 has been formed on the film 30. Third BN+ mask 31 has been patterned with "BN+" openings 31' therethrough. N+ dopant is implanted through the "BN+" openings 31' in channel mask 31 into a plurality of BN+ regions 32, 32' and 32".

Between BN+ regions 32, 32' and 32" channel regions C5 and C6 are formed, among many other channel regions not discussed for convenience of description. The preferred chemical species of the dopant 33 implanted is Arsenic with a doping concentration from about 5 E 18 atoms/$cm^3$ to about 1 E 20 atoms/$cm^3$, at an energy from about 30 keV to about 120 keV.

As a result of this step, within the film 30, surrounding P– channel regions C5 and C6 below the photoresist mask 31, which remain undoped by the P+ dopant ion 31, during the formation of the channel regions C5 and C6 because of the protection afforded by the channel mask 31 are located buried N+ (BN+) S/D regions 32, 32', 32", . . . .

Figure 3I:
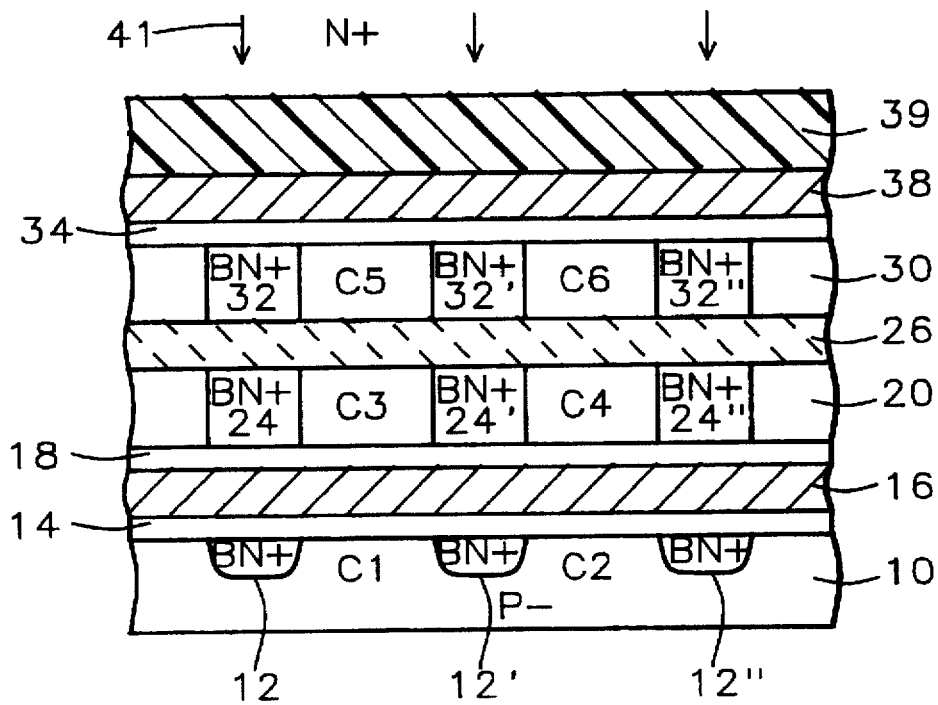
Figure 4I:
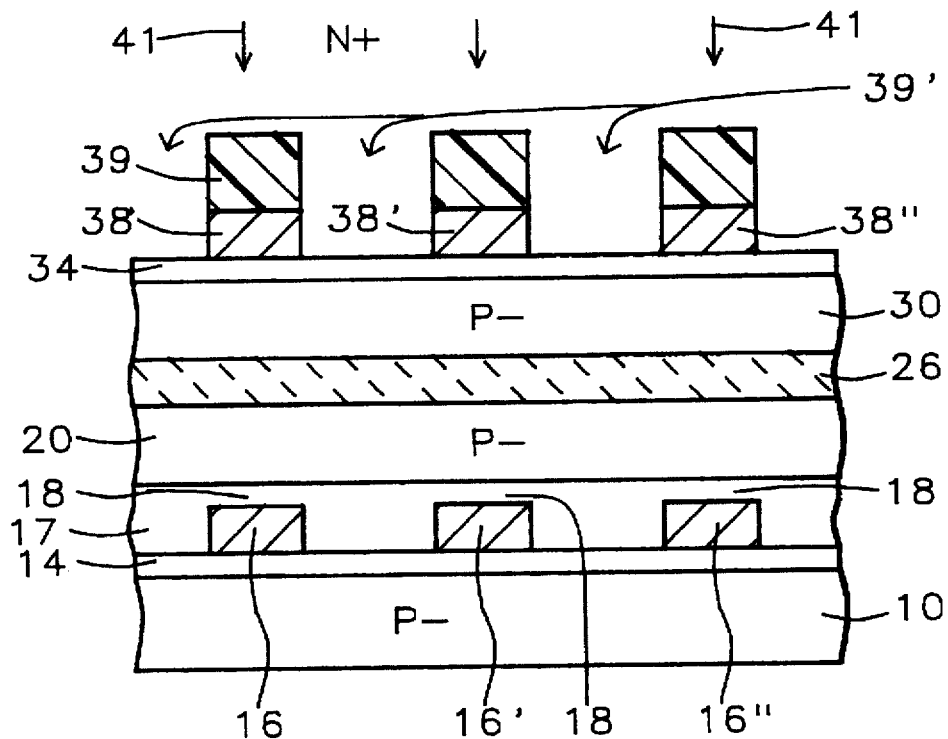
Figure 5B:
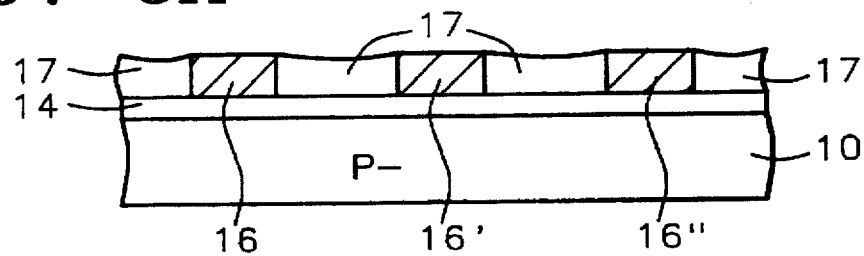
Figure 5C:
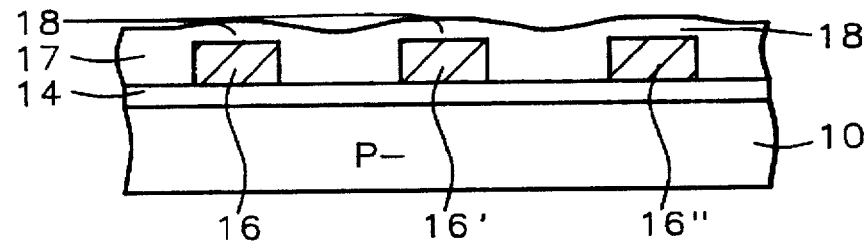

Again the device of FIGS. 3H and 4H are stripped of the photoresist mask 31 and are planarized as described above with reference to FIGS. 5A–5C as shown with reference to FIGS. 3I and 4I which show the product of FIGS. 3H and 4H after the film 30 has been coated with a thin film of gate oxide 34 which is grown thermally on the exposed surface of film 30 and BN+ S/D regions 32, 32', 32".

After layer film 30 was formed, a second blanket polysilicon/polycide control gate/wordline layer 38 has been formed on the gate oxide layer 34 followed by formation of a patterned photoresist mask 39 formed over layer 38 with openings 39' (FIG. 4H) therethrough to form wordlines 38, 38', 38" (FIG. 4C) by etching away portions of layer 38 below the openings 39' with a conventional etchant for polysilicon/polycide.

Layer 38 is formed to a thickness from about 2,700 Å to about 5,000 Å using a conventional method, such as LPCVD.

Figure 3J:
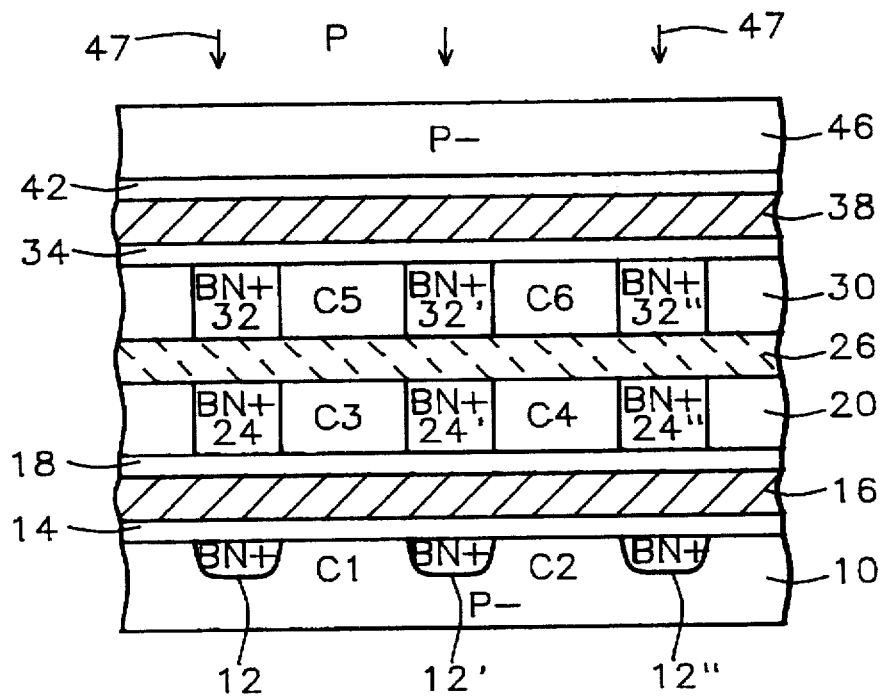
Figure 4J:
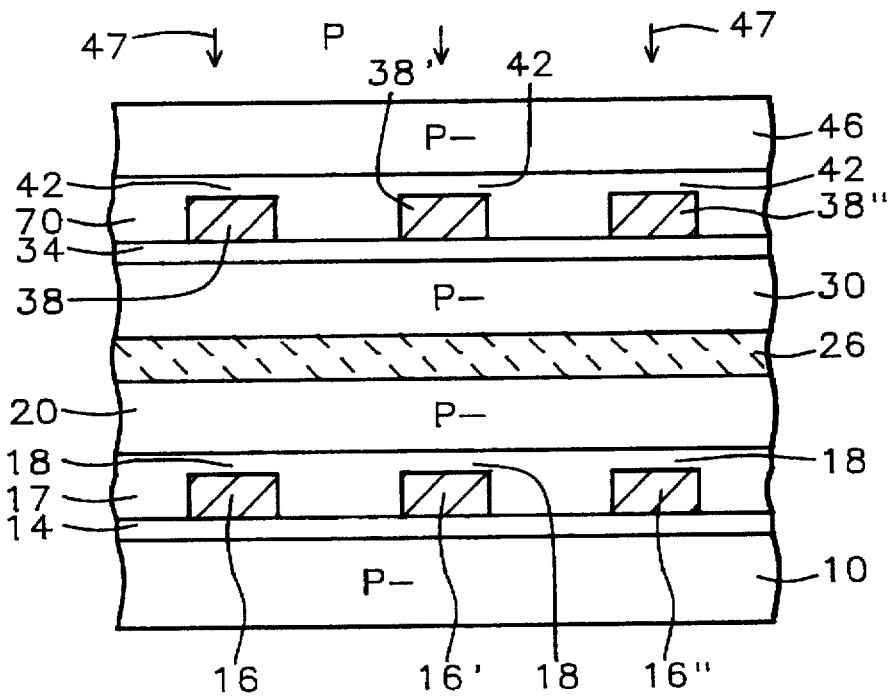

Referring to FIGS. 3J and 4J, the device of FIGS. 3I and 4I is stripped of the photoresist mask 39, after which the device is planarized by a silicon oxide layer 70 as described above with reference to layer 17 in FIGS. 5A–5C after stripping of mask 39 and then later formation of a silicon dioxide, gate oxide layer 42 over the wordlines 38, 38', 38" as shown in FIG. 4J. Formed over the gate oxide layer 42 was deposited an undoped thin film of polycrystalline silicon 46 for Thin Film Transistors (TFT's). Film 46 was formed by Chemical Vapor Deposition (CVD) from silane ($SiH_4$) gas in a chemical vapor deposition chamber. Preferably the CVD process is an LPCVD (Low Pressure CVD) process performed at a temperature from about 575° C. to about 650° C.

Next, film 46 is shown being doped with a blanket ion implantation of P-type dopant ions 47. The preferred chemical species of the dopant ions 47 implanted is Boron with a doping concentration from about 4 E 14 atoms/cm$^2$ to about 5 E 17 atoms/cm$^2$, at an energy from about 20 keV to about 100 keV.

Figure 3K:
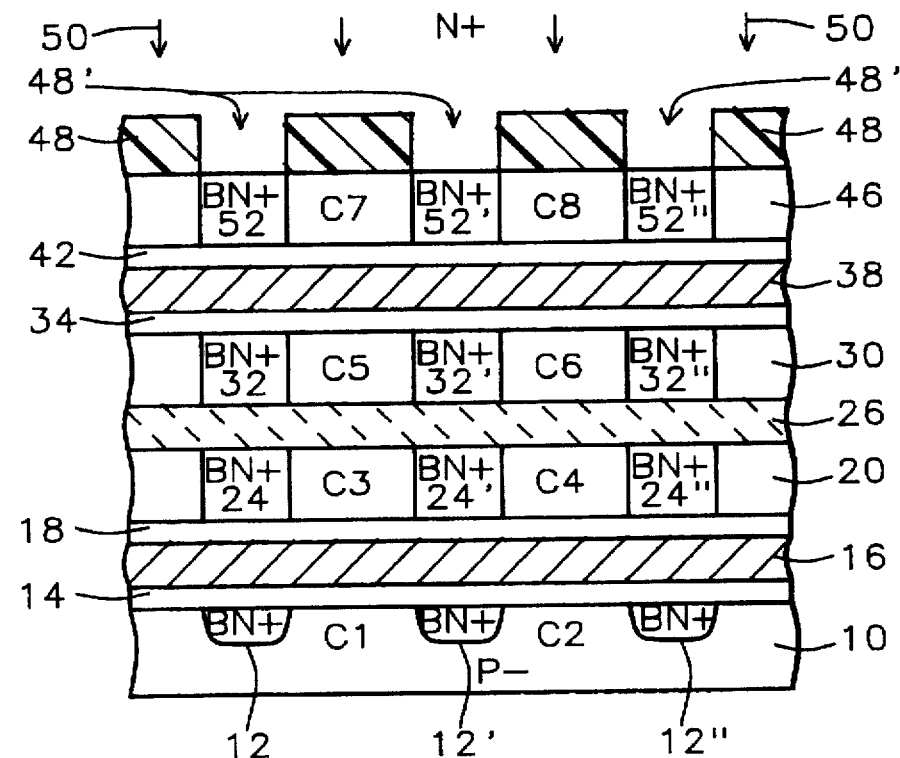
Figure 3L:
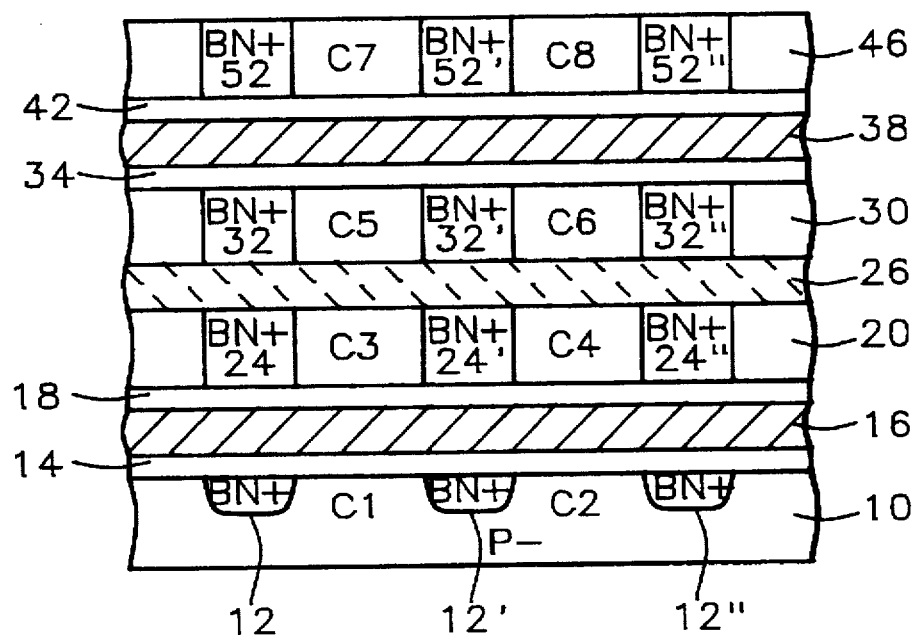
Figure 4K:
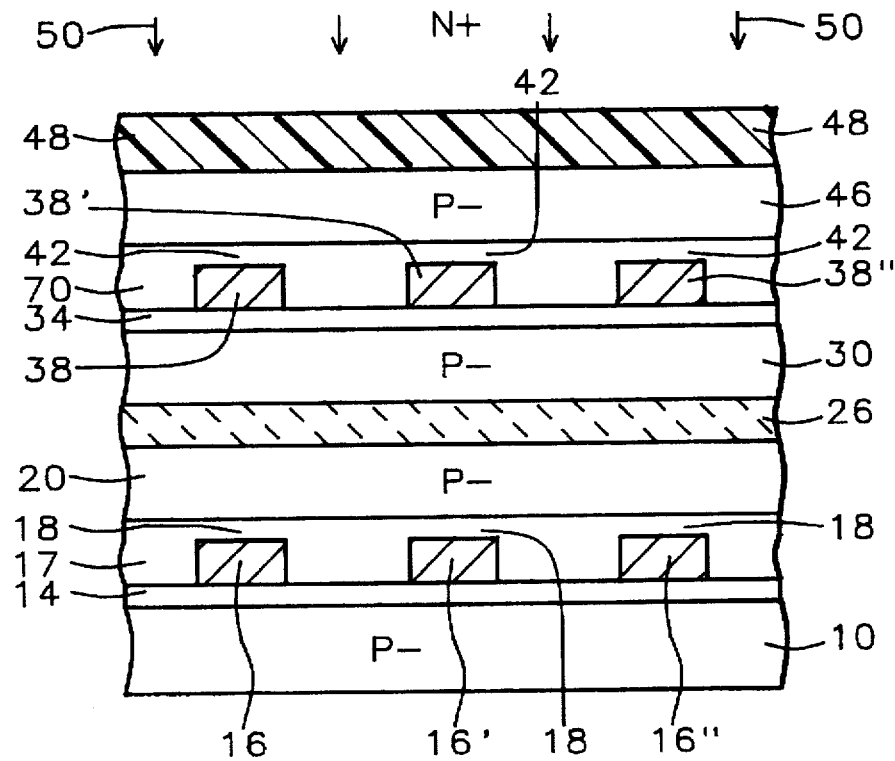
Figure 4L:
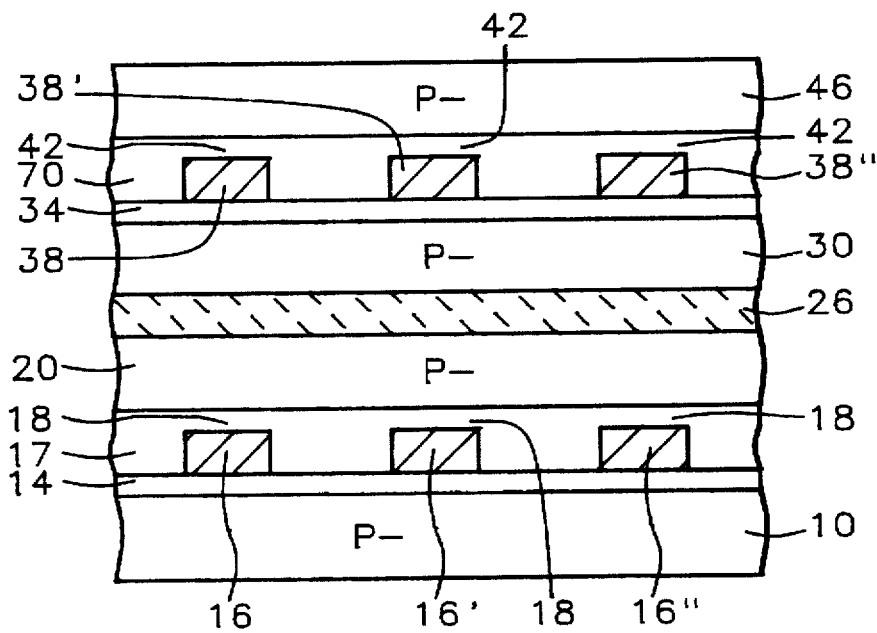

FIGS. 3K and 4K show the product of FIGS. 3J and 4J after a photoresist layer patterned into a fourth BN+ mask 48 with "BN+" openings 48' therethrough has been formed on the film 46. Fourth BN+ mask 48 has been patterned with "BN+" openings 48' therethrough. N+ dopant ions 50 are implanted through the "BN+" openings 48' in BN+ mask 48 into a plurality of BN+ regions 52, 52', and 52". The preferred chemical species of the dopant 50 implanted is Arsenic with a doping concentration from about 5 E 18 atoms/cm$^3$ to about 1 E 20 atoms/cm$^3$, at an energy from about 30 keV to about 120 keV.

As a result of this step, within the film 46, surrounding BN+ S/D regions 52, 52', and 52" between channel regions C7 and C8 below the photoresist mask 48, which remain undoped by the N+ dopant ion 50, during the formation of the BN+ regions C7 and C8 because of the protection afforded by the channel mask 48.

FIGS. 3K and 4K show the product of FIGS. 3J and 4J after the photoresist layer 48 is stripped from the structure of FIGS. 3K and 4K.

On top of the structure of FIGS. 3K and 4K additional layers identical to layer 26, 30, 34, 38, 42 and 46 can be stacked in repeated layers using the same techniques to further increase the capacity of the ROM memory device of this invention.

Other steps not shown in this application are the steps for formation of photolithographic mask layers which have been exposed and developed forming an ROM code # mask. The ROM code # is formed by an P type dose implant of ions into polysilicon channel regions C1, C2, C3, C4, C5, C6, C7, C8. The implanted P dose will increase the P channel doping in channel regions to a heavier P type doping level. The heavier doping level produced turns the N-channel transition off permanently.

The preferred chemical species of the dopant implanted is Boron (B) with a doping concentration from about 5 E 12 atoms/cm$^3$ to about 5 E 14 atoms/cm$^3$, at an energy from about 30 keV to about 180 keV. With a heavier P type implant, the channel region becomes P (1 E 16 atoms/cm$^3$ to 5 E 19 atoms/cm$_3$).

Then the resist layers are removed by a conventional resist stripping process.

SUMMARY

High density is achieved by the process of this invention. Features of importance to the process are as follows:
1. Bitlines (BN+) are formed through implantation.
2. Polysilicon (polycide) form wordlines.
3. Bits of "0" or "1" are defined through implanting ions at selected channel regions of C1, C2, C3, C4, C5, C6, C7, and C8 among others.
5. Planarization is achieved through a chemical vapor deposition (CVD) and etch back process or chemical mechanical polishing, as described in connection with FIGS. 5A-5C.
6. Gate materials are CVD polysilicon or polycide and doped.
7. Gate oxide layers 14, 18, 34, and 42 are thermally grown.
8. Silicon storage planes, polysilicon storage plane layer 20 (CVD), polysilicon storage plane layer 30 (CVD)2 and polysilicon storage plane layer 46 (CVD)3 are formed by chemically vapor deposition (CVD).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a ROM structure on a doped silicon semiconductor substrate having a surface, said method comprising said the steps as follows:

forming a dielectric layer on said surface of said substrate, forming a first array of bitlines in said substrate at said surface below said dielectric layer, forming a first parallel array of wordlines over said dielectric layer, said first array of wordlines being orthogonally oriented relative to said first array of bitlines, forming a gate oxide layer covering said wordlines and exposed portions of said dielectric layer, forming a first thin film polysilicon layer over said gate first dielectric layer comprising a second array of alternating parallel bitlines and channel regions, said second array of bitlines and channel regions being orthogonally disposed relative to said first wordline array.

2. A method in accordance with claim 1 wherein planarization of wordlines is achieved through formation of an oxide layer planarized by a method selected from the group consisting of an etchback process and a chemical mechanical polishing process.

3. A method in accordance with claim 1 wherein said wordlines are formed of polysilicon deposited by chemical vapor deposition followed by doping.

4. A method in accordance with claim 1 wherein said process of forming said gate oxide layer and said dielectric layer comprises thermal growth thereof.

5. A method in accordance with claim 1 wherein said process of forming said first thin film polysilicon layer over said dielectric layer comprises chemical vapor deposition.

6. A method in accordance with claim 2 wherein said wordlines are formed of polysilicon deposited by chemical vapor deposition followed by doping.

7. A method in accordance with claim 6 wherein said process of forming said gate oxide layer and said dielectric layer comprises thermally growth thereof.

8. A method in accordance with claim 7 wherein said process of forming said first thin film polysilicon layer over said dielectric layer comprises chemical vapor deposition.

9. A method in accordance with claim 1 wherein said steps are performed as follows:

an isolation dielectric layer is formed over said first thin film polysilicon layer, forming a second thin film polysilicon layer over said isolation dielectric layer, forming a third array of bitlines and channel regions in said second thin film polysilicon layer, forming a second dielectric layer covering said second thin film polysilicon layer, forming a second parallel array of wordlines over said second dielectric layer, said second array of wordlines being orthogonally oriented relative to said third array of bitlines, forming a third dielectric layer covering said second array of wordlines and exposed portions of said second dielectric layer, forming a third thin film polysilicon layer over said third dielectric layer, and forming a fourth array of bitlines and channel regions in said third thin film polysilicon layer.

10. A method in accordance with claim 9 wherein planarization of wordlines is achieved through formation of an oxide layer planarized by a method selected from the group consisting of an etchback process and a chemical mechanical polishing process.

11. A method in accordance with claim 9 wherein said wordlines are formed of polysilicon deposited by chemical vapor deposition followed by doping.

12. A method in accordance with claim 9 wherein said process of forming said gate oxide layer and said dielectric layers comprises thermal growth thereof.

13. A method in accordance with claim 9 wherein said process of forming said thin film polysilicon layers comprises chemical vapor deposition.

14. A method in accordance with claim 10 wherein said wordlines are formed of polysilicon deposited by chemical vapor deposition followed by doping.

15. A method in accordance with claim 14 wherein said process of forming said gate oxide layer and said dielectric layers comprises thermal growth thereof.

16. A method in accordance with claim 15 wherein said process of forming said thin film polysilicon layers comprises chemical vapor deposition.

17. A method in accordance with claim 1 wherein said ROM code dopant comprises Boron.

18. A method in accordance with claim 9 wherein said ROM code dopant comprises Boron.

19. A method in accordance with claim 15 wherein said ROM code dopant comprises Boron.

20. A method in accordance with claim 16 wherein said ROM code dopant comprises Boron.

* * * * *

UNITED STATES PATENT AND TRADEMARK OFFICE
CERTIFICATE OF CORRECTION

PATENT NO. : 5,721,169
DATED : February 24, 1998
INVENTOR(S) : Bob Hsiao-Lun Lee It is certified that error appears in the above-indentified patent and that said Letters Patent is hereby corrected as shown below:

On the Title Page, at (75), delete "BOB HSINO-LUN LEE" and replace with --BOB HSIAO-LUN LEE--.

Signed and Sealed this

Twelfth Day of January, 1999

Attest:

Attesting Officer

*Acting Commissioner of Patents and Trademarks*